US012684809B2

(12) United States Patent
Cai et al.

(10) Patent No.: US 12,684,809 B2
(45) Date of Patent: Jul. 14, 2026

(54) SPLIT-GATE MOSFET AND MANUFACTURING METHOD THEREOF

(71) Applicant: Hangzhou Silicon-Magic Semiconductor Technology Co., Ltd., Hangzhou City (CN)

(72) Inventors: Jinyong Cai, Hangzhou City (CN); Shida Dong, Hangzhou City (CN); Jiakun Wang, Hangzhou City (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 616 days.

(21) Appl. No.: 18/089,726

(22) Filed: Dec. 28, 2022

(65) Prior Publication Data

US 2023/0207685 A1 Jun. 29, 2023

(30) Foreign Application Priority Data

Dec. 29, 2021 (CN) .......................... 202111635852.4

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0297* (2025.01); *H10D 64/01* (2025.01); *H10D 64/117* (2025.01); *H10D 64/518* (2025.01)

(58) Field of Classification Search
CPC .......... H10D 30/0297; H10D 30/0285; H10D 64/025; H10D 64/117; H10D 64/518; H10D 30/668
See application file for complete search history.

(56) References Cited

U.S. PATENT DOCUMENTS 4,495,025 A * 1/1985 Haskell ............. H10W 10/0145
257/E21.549
7,232,726 B2 * 6/2007 Peake .................. H10D 30/028
257/E29.256
(Continued)

FOREIGN PATENT DOCUMENTS

CN 101238581 A 8/2008
CN 101626033 A 1/2010
(Continued)

OTHER PUBLICATIONS

U.S. Appl. No. 17/986,977, filed Nov. 15, 2022, entitled "Split-Gate Mosfet and Manufacturing Method Thereof", 32 pages.
(Continued)

*Primary Examiner* — Joseph C. Nicely
(74) *Attorney, Agent, or Firm* — Westman, Champlin & Koehler, P.A.

(57) ABSTRACT

Disclosed is a split-gate MOSFET and a manufacturing method, including: forming a first trench in a semiconductor layer; forming a second trench communicated with the first trench by using the first trench; forming a first dielectric layer in the second trench, a second dielectric layer in the first trench; forming a first conductor, located in the second trench, isolated from the semiconductor layer by the first dielectric layer; forming a third dielectric layer covering the first conductor; forming a second conductor, located in the first trench, isolated from the semiconductor layer by the second dielectric layer, the first conductor being isolated from the second conductor by the third dielectric layer; forming a body region adjacent to the first trench, the first trench has an inner diameter greater than that of the second trench. Thus, process window is expanded and beneficial to forming the third dielectric layer.

8 Claims, 11 Drawing Sheets

100

(51) Int. Cl.

| | |
|---|---|
| *H10D 64/00* | (2025.01) |
| *H10D 64/01* | (2025.01) |
| *H10D 64/27* | (2025.01) |

(56) References Cited

U.S. PATENT DOCUMENTS

| | | | |
|---|---|---|---|
| 7,385,248 B2 | 6/2008 | Herrick et al. | |
| 7,598,144 B2 | 10/2009 | Herrick et al. | |
| 7,910,437 B1* | 3/2011 | Baek | H10D 30/668 |
| | | | 257/E21.629 |
| 7,936,009 B2 | 5/2011 | Pan et al. | |
| 7,977,193 B1* | 7/2011 | Disney | H10D 30/668 |
| | | | 257/E29.257 |
| 7,998,808 B2* | 8/2011 | Viswanathan | H10D 30/0295 |
| | | | 257/E21.549 |
| 8,329,538 B2 | 12/2012 | Pan et al. | |
| 8,679,921 B2* | 3/2014 | Flachowsky | H10D 30/63 |
| | | | 438/270 |
| 9,356,132 B2* | 5/2016 | Su | H10D 30/668 |
| 9,570,545 B2* | 2/2017 | Dong | H10D 62/109 |
| 9,761,695 B1* | 9/2017 | Fan | H10D 64/117 |
| 10,109,732 B2* | 10/2018 | Ng | H01L 21/26586 |
| 10,319,851 B2* | 6/2019 | Chun | H10D 62/8325 |
| 10,332,992 B1* | 6/2019 | Kondo | H10D 64/513 |
| 11,088,253 B2 | 8/2021 | Qi | |
| 12,439,620 B2* | 10/2025 | Takizawa | H10D 12/481 |
| 2005/0208722 A1* | 9/2005 | Peake | H10D 30/668 |
| | | | 257/E29.136 |
| 2007/0037327 A1 | 2/2007 | Herrick et al. | |
| 2007/0138547 A1* | 6/2007 | Nakamura | H10D 64/117 |
| | | | 257/331 |
| 2008/0001214 A1* | 1/2008 | Yamaoka | H10D 64/027 |
| | | | 257/E21.429 |
| 2008/0035987 A1* | 2/2008 | Hebert | H10D 30/664 |
| | | | 257/330 |
| 2008/0090339 A1 | 4/2008 | Herrick et al. | |
| 2010/0006928 A1 | 1/2010 | Pan et al. | |
| 2011/0039383 A1* | 2/2011 | Chen | H10D 30/665 |
| | | | 438/270 |
| 2011/0220990 A1* | 9/2011 | Chang | H10D 30/665 |
| | | | 438/270 |
| 2011/0244641 A1 | 10/2011 | Pan et al. | |
| 2012/0187472 A1* | 7/2012 | Chang | H10D 89/711 |
| | | | 438/270 |
| 2013/0320435 A1* | 12/2013 | Ng | H10D 30/0295 |
| | | | 438/270 |
| 2014/0015039 A1 | 1/2014 | Hossain | |
| 2019/0006479 A1 | 1/2019 | Hsu et al. | |
| 2019/0109216 A1* | 4/2019 | Cai | H10D 30/0297 |
| 2020/0001386 A1 | 1/2020 | Qi | |
| 2022/0285549 A1* | 9/2022 | Kim | H10D 64/01 |
| 2023/0207684 A1* | 6/2023 | Cai | H10D 30/668 |
| | | | 257/330 |

FOREIGN PATENT DOCUMENTS

| | | |
|---|---|---|
| CN | 109216175 A | 1/2019 |
| CN | 114156183 A | 3/2022 |

OTHER PUBLICATIONS

First Office Action, including search report, for Chinese patent application No. 202111635852.4, dated Mar. 15, 2024, 26 pages.

US Office Action for U.S. Appl. No. 17/986,977 dated Mar. 26, 2025, entitled "Split-Gate MOSFET and Manufacturing Method Thereof", 19 pages.

US Office Action for U.S. Appl. No. 17/986,977 dated Sep. 11, 2025, entitled "Split-Gate MOSFET and Manufacturing Method Thereof", 19 pages.

* cited by examiner

10

100

1124

125

111

101

100

1121

125

1123

111

101

100

100

100

100

100

100

100

100

SPLIT-GATE MOSFET AND MANUFACTURING METHOD THEREOF

CROSS-REFERENCE TO RELATED APPLICATIONS

The present application claims priority to Chinese Patent Application No. 202111635852.4, filed on Dec. 29, 2021, entitled by "SPLIT-GATE MOSFET AND MANUFAC-TURING METHOD THEREOF", and published as CN114678275A on Jun. 28, 2022, which is incorporated herein by reference in its entirety.

FIELD OF TECHNOLOGY

The present disclosure relates to a technical field of semiconductors, and more specifically, to a split-gate metal oxide semiconductor field effect transistor (MOSFET) and a manufacturing method of a split-gate MOSFET.

BACKGROUND

A trench power MOSFET (Metal Oxide Semiconductor Field Effect Transistor) is a kind of high efficiency switching device developed after planar VDMOS (Vertical Double-diffused Metal Oxide Semiconductor Field Effect Transistor. The trench power MOSFET is widely used in power electronics field because of its high input impedance, low driving current, fast switching speed and good high-temperature characteristics. High breakdown voltage, large current and low on-resistance are most critical indexes of a power MOSFET, wherein the breakdown voltage is related to the on-resistance. In a design process of a MOSFET, it is difficult to implement high breakdown voltage and low on-resistance at the same time, so that it is necessary to tradeoff between them.

In order to make the breakdown voltage as high as possible and the on-resistance as low as possible, a new type of split-gate MOSFET comes into being, and compared with an ordinary trench MOSFET structure, a main feature of a split-gate MOSFET is that, a deep trench split gate is added and is short-connected with a source, and a split gate is used to balance electric field for improving a withstand voltage of the device.

However, in the existing split-gate MOSFET, because the trench has a small critical dimension (CD), a dielectric layer between a first conductor and a second conductor in the trench is prone to generate voids after deposition, which may affect mechanical strength and electrical performance of the device, and there is also a risk of leakage.

Therefore, it is desirable to provide an improved method of manufacturing a split-gate MOSFET, to avoid generating a void in the dielectric layer between the first conductor and the second conductor in the trench and reduce the risk of leakage.

SUMMARY

In view of the above problems, an objective of the present disclosure is to provide a split-gate MOSFET and a manu-facturing method thereof, so as to avoid creating a void in a dielectric layer between a first conductor and a second conductor in a trench, and reduce a risk of leakage.

According to a first aspect of the present disclosure, a manufacturing method of a split-gate MOSFET is provided, and includes: forming a first trench extending from an upper surface of a semiconductor layer of a first dopant type to an interior of the semiconductor layer; forming a second trench communicated with the first trench by using the first trench, the first trench and the second trench extending in a same extension; forming a first dielectric layer covering an inner surface of the second trench and a second dielectric layer covering an inner surface of the first trench; forming a first conductor located in the second trench, the first conductor being isolated from the semiconductor layer by the first dielectric layer; forming a third dielectric layer covering a surface of the first conductor; forming a second conductor located in the first trench, the second conductor being isolated from the semiconductor layer by the second dielec-tric layer, the first conductor being isolated from the second conductor by the third dielectric layer; and forming a body region of a second dopant type that is located in the semiconductor layer and is adjacent to the first trench, where an inner diameter of the first trench is greater than an inner diameter of the second trench.

Optionally, the step of forming the first trench includes: forming a cavity extending from the upper surface of the semiconductor layer of the first dopant type to the interior of the semiconductor layer; and forming a molding layer covering a sidewall of the cavity, where an inner diameter of a portion, which is close to a lower part of the cavity, of the molding layer is smaller than an inner diameter of a portion, which is close to a top of the cavity, of the molding layer, and the first trench is formed at a portion, which is free of the molding layer, of the cavity, where an inner diameter of a bottom of the first trench is smaller than an inner diameter of a top of the first trench, and the inner diameter of the second trench is consistent with the inner diameter of the bottom of the first trench.

Optionally, an inner diameter of the molding layer gradu-ally increases from bottom to top, such that the inner diameter of the first trench gradually increases from bottom to top.

Optionally, the step of forming the molding layer includes: forming a dielectric material covering the sidewall of the cavity; and removing part of the dielectric material to form the molding layer.

Optionally, a thickness of the first dielectric layer is greater than a thickness of the second dielectric layer.

Optionally, the manufacturing method further includes: forming a source region located in the body region, the source region being of the first dopant type; forming an interlayer dielectric layer located on the source region; and forming a source electrode located on the interlayer dielec-tric layer.

Optionally, the manufacturing method further includes: forming a body contact region of the second dopant type located in the body region; and forming a conductive channel that penetrates the interlayer dielectric layer and the source region to reach the body contact region, the source electrode being connected to the body contact region via the conductive channel.

Optionally, the semiconductor layer is formed on a semi-conductor substrate, the semiconductor substrate is located on a lower surface of the semiconductor layer, and the upper surface of the semiconductor layer is opposite to the lower surface of the semiconductor layer; and the manufacturing method further includes: forming a drain electrode located on a lower surface of the semiconductor layer.

According to a second aspect of the present disclosure, a split-gate MOSFET is provided and includes: a semicon-ductor layer of a first dopant type; a first trench extending from an upper surface of the semiconductor layer to an interior of the semiconductor layer, and a second trench communicated with a bottom of the first trench, where the first trench and the second trench extend in a same extension; a first dielectric layer covering an inner surface of the second trench, a second dielectric layer covering an inner surface of the first trench, and a third dielectric layer located between the first dielectric layer and the second dielectric layer; a first conductor located in the second trench and a second conductor located in the first trench, where the first conductor is isolated from the semiconductor layer by the first dielectric layer, the second conductor is isolated from the semiconductor layer by the second dielectric layer, and the first conductor is isolated from the second conductor by the third dielectric layer; and a body region of a second dopant type that is located in the semiconductor layer and is adjacent to the first trench, where an inner diameter of the first trench is greater than an inner diameter of the second trench.

Optionally, the inner diameter of the first trench gradually increases from bottom to top.

Optionally, the first trench is formed by forming a cavity extending from the upper surface of the semiconductor layer of the first dopant type to the interior of the semiconductor layer and forming a molding layer covering a sidewall of the cavity, and an inner diameter of a portion, which is close to a lower part of the cavity, of the molding layer is smaller than an inner diameter of a portion, which is close to a top of the cavity, of the molding layer, such that an inner diameter of the bottom of the first trench is smaller than an inner diameter of a top of the first trench, and the inner diameter of the second trench is consistent with the inner diameter of the bottom of the first trench.

Optionally, a thickness of the first dielectric layer is greater than a thickness of the second dielectric layer.

Optionally, the split-gate MOSFET further includes: a source region located in the body region, the source region being of the first dopant type; an interlayer dielectric layer located on the source region; and a source electrode located on the interlayer dielectric layer.

Optionally, the split-gate MOSFET further includes: a body contact region of the second dopant type located in the body region; and a conductive channel that penetrates the interlayer dielectric layer and the source region to reach the body contact region, the source electrode being connected to the body contact region via the conductive channel.

Optionally, the split-gate MOSFET further includes: a semiconductor substrate located on a lower surface of the semiconductor layer, the upper surface of the semiconductor layer being opposite to the lower surface of the semiconductor layer; and a drain electrode located on the lower surface of the semiconductor substrate.

In the split-gate MOSFET and the manufacturing method thereof provided according to embodiments of the present disclosure, the inner diameter of the first trench is set to be greater than the inner diameter of the second trench, thereby being beneficial to expanding process window, preventing a void from being created in the third dielectric layer, and at the same time, the device size is not affected.

BRIEF DESCRIPTION OF THE DRAWINGS

The above and other objectives, features and advantages of the present disclosure will become more apparent from the description of the embodiments of the present disclosure below with reference to the accompanying drawings, in which.

DESCRIPTION OF THE EMBODIMENTS

Figure 1:
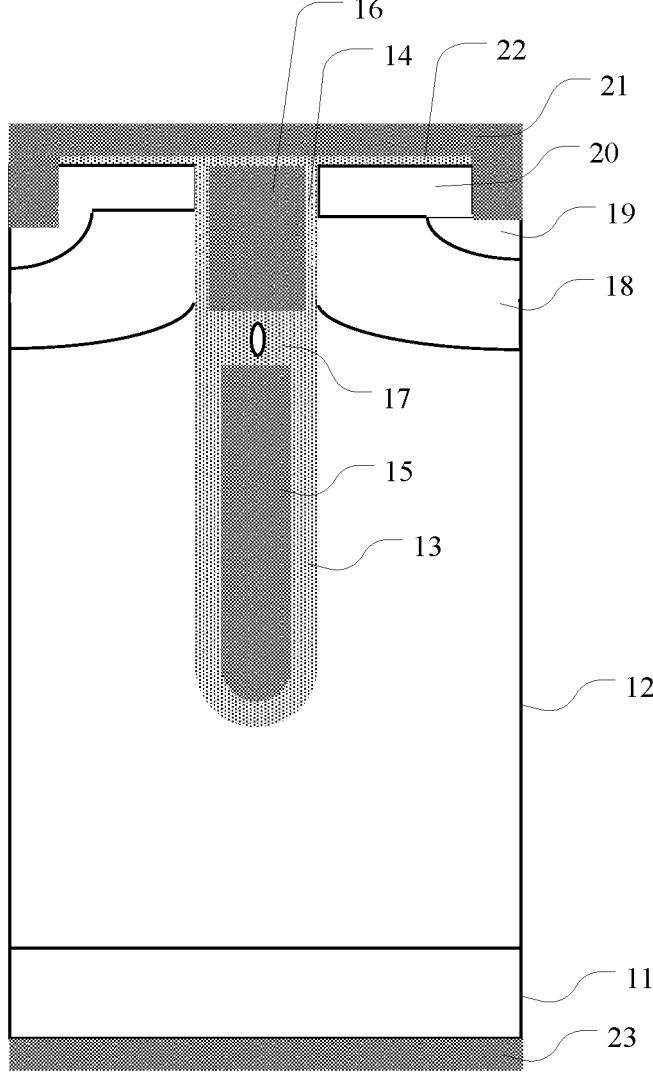
FIG. 1 shows a cross-sectional view of a conventional split-gate MOSFET.

The present disclosure will be described in more detail below with reference to the accompanying drawings. Throughout the various figures, like elements are denoted by the same or similar reference numerals. For the sake of clarity, various parts in the drawings are not drawn to scale. In addition, some well-known parts may not be shown. For the sake of simplicity, the semiconductor structure after several steps may be described in one diagram.

In a case that one layer or one region is referred to as being located "on" or "above" another layer or another region when a structure of a device is described, it means the one layer or the one region is located above another layer or another region, with or without additional layers or additional regions therebetween. Moreover, in a case that the device is turned upside down, the one layer or the one region will be "under" or "below" another layer or another region.

In a case that the one layer or the one region is located directly on another layer or another region, the expression will be "A is located directly on B", "A is located on and adjacently contacted with B".

In the present disclosure, the term "semiconductor structure" refers to a generic designation of an entire semiconductor structure formed in the various steps of manufacturing a device, including all layers and/or regions that have been formed.

Many specific details of the present disclosure, such as a structure, a material, a dimension, a processing process and a technique of the device, are described below, so that the present disclosure can be clearly understood. However, as will be understood by those skilled in the art, the present disclosure may be achieved without these specific details.

Unless specifically noted below, portions of the semiconductor device may be constructed of materials well known to those skilled in the art. Semiconductor materials include, for example, Group III-V semiconductors, such as GaAs, InP, GaN, SiC, and Group IV semiconductors, such as Si, Ge. A gate conductor may be formed of various materials capable of conducting electricity, such as a metal layer, a doped polysilicon layer, or a stacked gate conductor comprising a metal layer and a doped polysilicon layer, or other conductive materials, such as TaC, TiN, TaSiN, HfSiN, TiSiN, TiCN, TaAlC, TiAlN, TaN, PtSix, Ni3Si, Pt, Ru, W, and combinations of the various conductive materials. A gate dielectric layer may be formed of $SiO_2$ or a material which has a dielectric constant greater than $SiO_2$, and includes, for example, an oxide, a nitride, a silicate, an aluminate, and/or a titanate. Moreover, the gate dielectric may be formed not only from a material well known to those skilled in the art, but also from a material to be developed for the gate dielectric layer in the future.

The present disclosure can be presented in various forms, and some examples will be described below.

FIG. 1 shows a cross-sectional view of a conventional split-gate MOSFET.

As shown in FIG. 1, the split-gate MOSFET 10 includes a semiconductor substrate 11 of a first conductivity type, an epitaxial layer 12 of the first conductivity type is provided on an upper surface of the semiconductor substrate 11 of the first conductivity type, a trench is located in the epitaxial layer 12 of the first conductivity type, a sidewall of the trench is covered with a first dielectric layer 13 and a second dielectric layer 14. A core portion of the trench is a first conductor 15 located in a lower half of the trench, and a second conductor 16 located in an upper half of the trench. A third dielectric layer 17 is provided between the first conductor 15 and the second conductor 16, the first conductor 15 is isolated from the epitaxial layer 12 of the first conductivity type by the first dielectric layer 13. A body region 18 of the second conductivity type is located on the epitaxial layer 12, and a heavily doped region 19 of the second conductivity type is located in an upper portion of the body region 18. The second conductor 16 is isolated from the body region 18 of the second conductivity type by the second dielectric layer 14. A heavily doped source region 20 of the first conductivity type is located on the body region 18 of the second conductivity type, a metal layer 21 is led out through a hole, which is formed in the heavily doped source region 20 of the first conductivity type and the heavily doped region 19 of the second conductivity type. The metal layer 21 and the second conductor 16 each are separated from the heavily doped source region 20 of the first conductivity type by a fourth dielectric layer 22, and a metal layer 23 is formed on a back surface of the semiconductor substrate 11.

In the split-gate MOSFET 10 shown in FIG. 1, since a critical dimension of the trench is small, when the third dielectric layer 17 is formed between the first conductor 15 and the second conductor 16, a void may be easily created in the third dielectric layer 17, which may affect mechanical strength and electrical performance of the device.

Noting the above problems affecting device yield, the inventors of the present disclosure improve the conventional split-gate MOSFET, so as to avoid creating a void in the dielectric layer between the first conductor and the second conductor.

Figure 2:
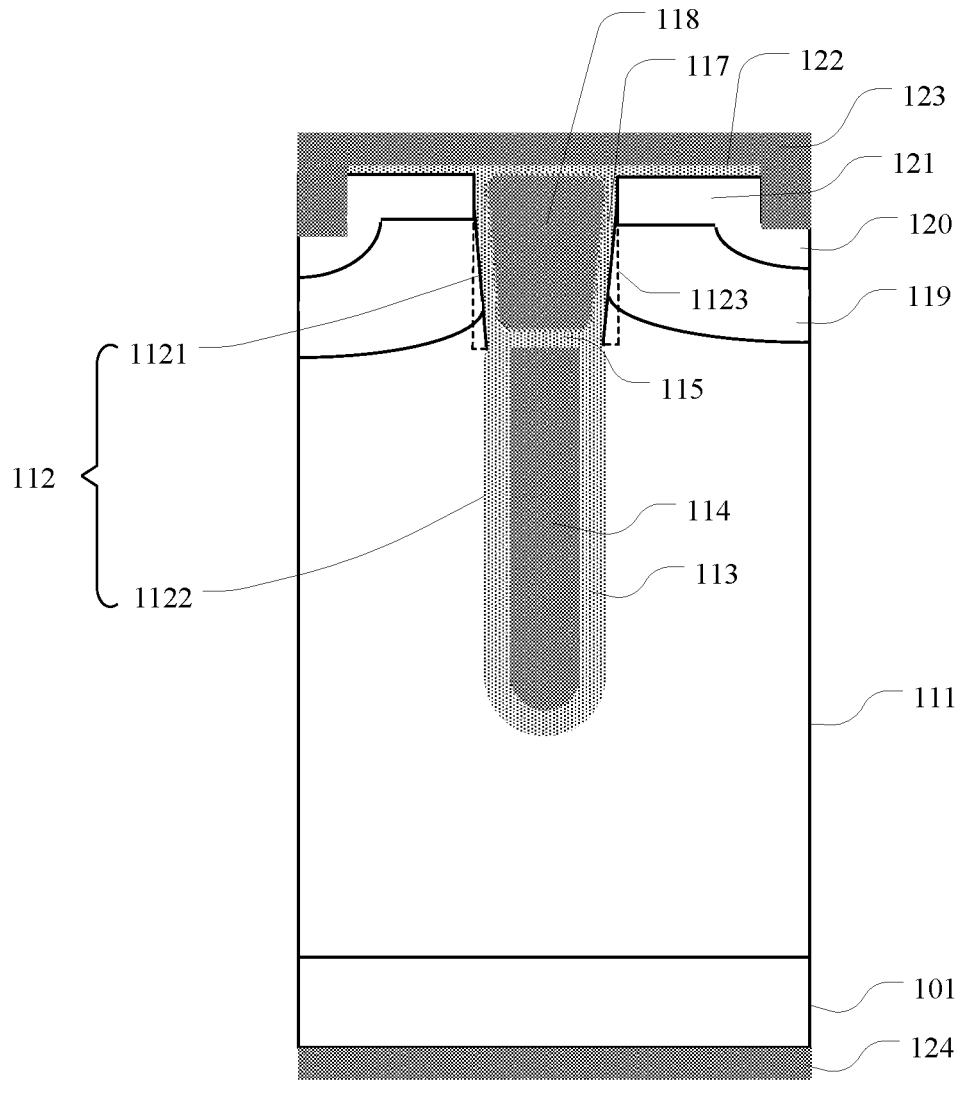
FIG. 2 shows a cross-sectional view of a split-gate MOSFET according to an embodiment of the present disclosure.

FIG. 2 shows a cross-sectional view of a split-gate MOSFET according to an embodiment of the present disclosure.

In the present disclosure, a semiconductor layer has a first dopant type, the first dopant type is one of an N dopant type (N-type) and a P dopant type (P-type), and the second dopant type is the other one of the N dopant type and the P dopant type. In order to form an epitaxial semiconductor layer or a region of N dopant type, N-type dopants (e.g., P, As) may be implanted into the epitaxial semiconductor layer or the region. In order to form an epitaxial semiconductor layer or a region of P dopant type, P-type dopants (e.g., B) may be doped into the epitaxial semiconductor layer or the region. In an example, the semiconductor layer is of N dopant type.

Specifically, the split-gate MOSFET 100 comprises a semiconductor substrate 101 and a semiconductor layer 111 disposed on the semiconductor substrate 101. In this embodiment, the semiconductor layer 111 is an epitaxial semiconductor layer, and the semiconductor substrate 101 has a first dopant type, for example, an N dopant type. The epitaxial semiconductor layer 111 is located on a surface, which is opposite to a drain electrode 124, of the semiconductor substrate 101, that is the epitaxial semiconductor layer 111 is located on a first surface of the semiconductor substrate 101. The epitaxial semiconductor layer 111 is, for example, composed of silicon. The epitaxial semiconductor layer 111 is a lightly doped layer with respect to the semiconductor substrate 101. A second surface of the semiconductor substrate 101 is thinned by a thinning technique, and the drain electrode 124 is formed on the second surface. In some embodiments, a buffer layer is also provided between the semiconductor substrate 101 and the epitaxial semiconductor layer 111, the dopant type of the buffer layer is the same as the semiconductor substrate, in order to reduce interface instability between the semiconductor substrate and the epitaxial semiconductor layer due to a defect of the semiconductor substrate.

The split-gate MOSFET further comprises: a trench 112 extending from an upper surface of the epitaxial semiconductor layer 111 into an interior of the epitaxial semiconductor layer 111; a dielectric layer and an electrode conductor located inside the trench; and a body region 119 of the second dopant type, which is located in the semiconductor layer and adjacent to the trench 112, wherein the trench terminates in the epitaxial semiconductor layer 111.

Specifically, the trench 112 includes a first trench 1121 extending from an upper surface of the semiconductor layer 111 to an interior of the semiconductor layer 111, and a second trench 1122 communicated with a bottom of the first trench 1121, the first trench 1121 and the second trench 1122 extend in a same extension. Optionally, the first trench 1121 is formed by forming a cavity extending from the upper surface of the semiconductor layer of the first dopant type to the interior of the semiconductor layer and forming a molding layer 1123 covering a sidewall of the cavity, and an inner diameter of a portion, which is close to a lower part of the cavity, of the molding layer 1123 is smaller than an inner diameter of a portion, which is close to a top of the cavity, of the molding layer, such that an inner diameter of the bottom of the first trench 1121 is smaller than an inner diameter of a top of the first trench 1121, and an inner diameter of the second trench 1122 is consistent with the inner diameter of the bottom of the first trench 1121. Optionally, the inner diameter of the first trench 1121 gradually increases from bottom to top.

A dielectric layer in the trench comprises a first dielectric layer 113 covering an inner surface of the second trench 1122, a second dielectric layer 117 covering an inner surface of the first trench 1121, and a third dielectric layer 115 positioned between the first dielectric layer 113 and the second dielectric layer 117. Optionally, the first dielectric layer 113 has a thickness greater than that of the second dielectric layer 117. Electrode conductors in the trench comprise a first conductor 114 located in the second trench 1122 and a second conductor 118 located in the first trench 1121, wherein the first conductor 114 is isolated from the epitaxial semiconductor layer 111 by the first dielectric layer 113, and the second conductor 118 is isolated from the epitaxial semiconductor layer 111 by the second dielectric layer 117. In this embodiment, the first conductor 114 is a shielding conductor, the second conductor 118 is a gate conductor, the second dielectric layer 117 is a gate dielectric layer, and the shielding conductor 114 is isolated from the gate conductor 118 by the third dielectric layer 115. A junction depth of the body region 119 is not deeper than an extension depth of the gate conductor 118 in the trench.

The split-gate MOSFET further comprises: a source region 121 of the first dopant type in the body region 119; a body contact region 120 of the second dopant type in the body region 119; an interlayer dielectric layer 122 formed on the source region 121 and the gate conductor 118; a conductive channel that penetrates the interlayer dielectric layer 122 and the source region 121 to reach the body contact region 120, and is located immediately adjacent to the source region 121; and a source electrode 123 which is formed on the interlayer dielectric layer 122 and is connected to the body contact region 120 via the conductive channel. The interlayer dielectric layer 122 may be an oxide layer having a certain thickness, for example, a silicon oxide layer.

FIGS. 3*a*-3*i* show cross-sectional views at various stages of a manufacturing method of a split-gate MOSFET according to an embodiment of the present disclosure.

Figure 3A:
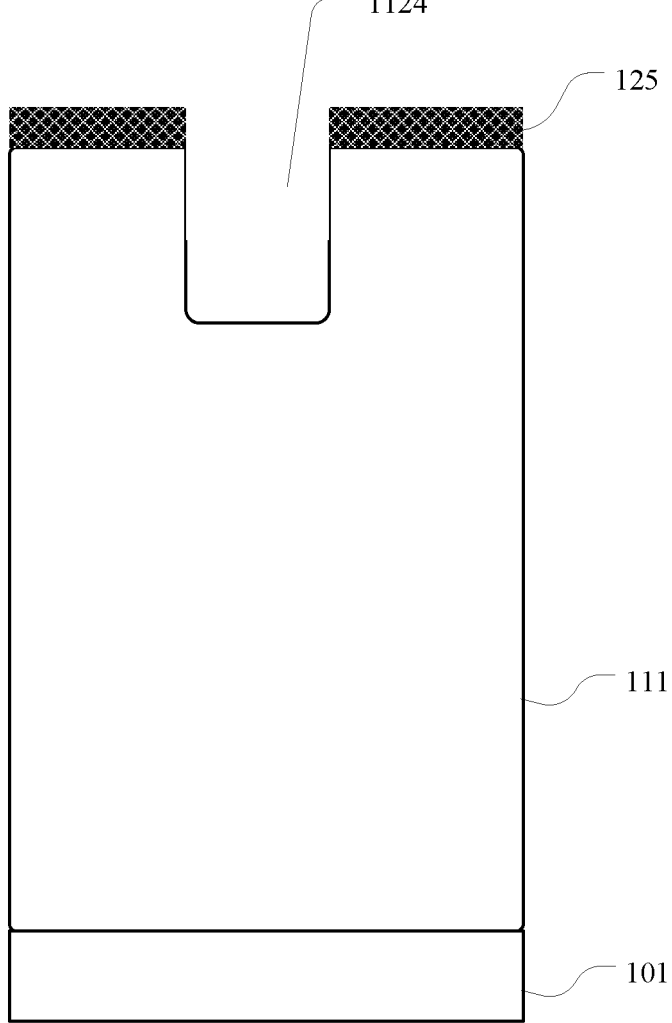
FIGS. 3a-3i show cross-sectional views at various stages of a manufacturing method of a split-gate MOSFET according to an embodiment of the present disclosure.
Figure 3B:
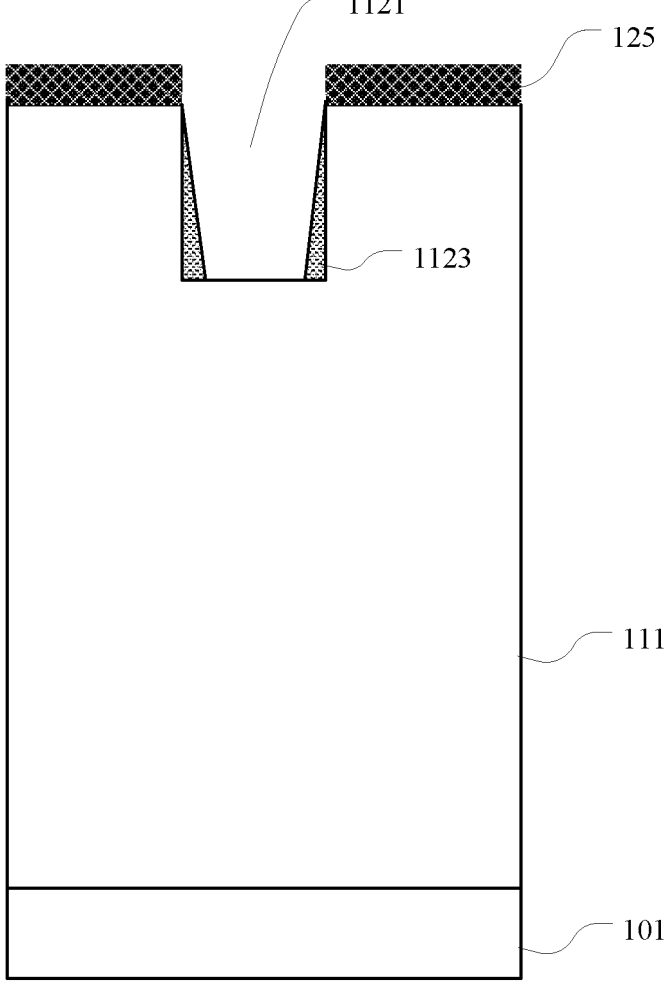

Step S1: a first trench 1121 extends from an upper surface to an interior of a semiconductor layer 111, which is of the first dopant type, and is formed, as shown in FIGS. 3*a*-3*b*.

In step S1, in the present disclosure, the split-gate MOSFET comprises: a semiconductor substrate 101 and a semiconductor layer 111 on the semiconductor substrate 101, wherein the semiconductor layer 111 is an epitaxial semiconductor layer; and an oxide layer formed on the epitaxial semiconductor layer 111. Then, a photoresist layer is formed on the oxide layer, and then an etching process is performed. By employ dry etching, such as ion milling etching, plasma etching, reactive ion etching, laser ablation, or by selective wet etching using an etching solution, the etching process is used to etch down from an opening in the photoresist mask to form a corresponding opening in the oxide layer, so that the oxide layer can be patterned and serve as a first hard mask 125. Due to etching selectivity, the etching process can be stopped on the surface of the epitaxial semiconductor layer 111. After the first hard mask 125 is formed, the photoresist layer is removed by ashing or dissolving in a solvent.

By use of the first hard mask 125, the epitaxial semiconductor layer 111 is further etched by the above-described known etching process to further form a cavity 1124 extending from the upper surface to the interior of the semiconductor layer 111 of the first dopant type. The cavity 1124 extends into the epitaxial semiconductor layer 111 from the upper surface of the epitaxial semiconductor layer 111. For example, by controlling etching time, a depth of the cavity 1124 can be controlled. The cavity 1124 terminates in the epitaxial semiconductor layer 111.

Further, as shown in FIG. 3*b*, a molding layer 1123 covering a sidewall of the cavity 1124 is formed, an inner diameter of a portion, which is close to a lower part of the cavity 1124, of the molding layer 1123 is smaller than an inner diameter of a portion, which is close to a top of the cavity 1124, of the molding layer, and the first trench 1121 is formed at a portion, which is free of the molding layer 1123, of the cavity 1124. An inner diameter of a bottom of the first trench 1121 is smaller than an inner diameter of a top of the first trench 1121. Optionally, the step of forming the molding layer 1123 includes: forming a dielectric material (for example, silicon oxide) covering the sidewall of the cavity 1124; and removing part of the dielectric material, so as to form the molding layer 1123. Optionally, the inner diameter of the molding layer gradually increases from bottom to top, such that the inner diameter of the first trench 1121 gradually increases from bottom to top.

In some other embodiments, a material of the molding layer 1123 and a material of the semiconductor layer 111 have a high etching selectivity and may serve as a hard mask.

Figure 3C:
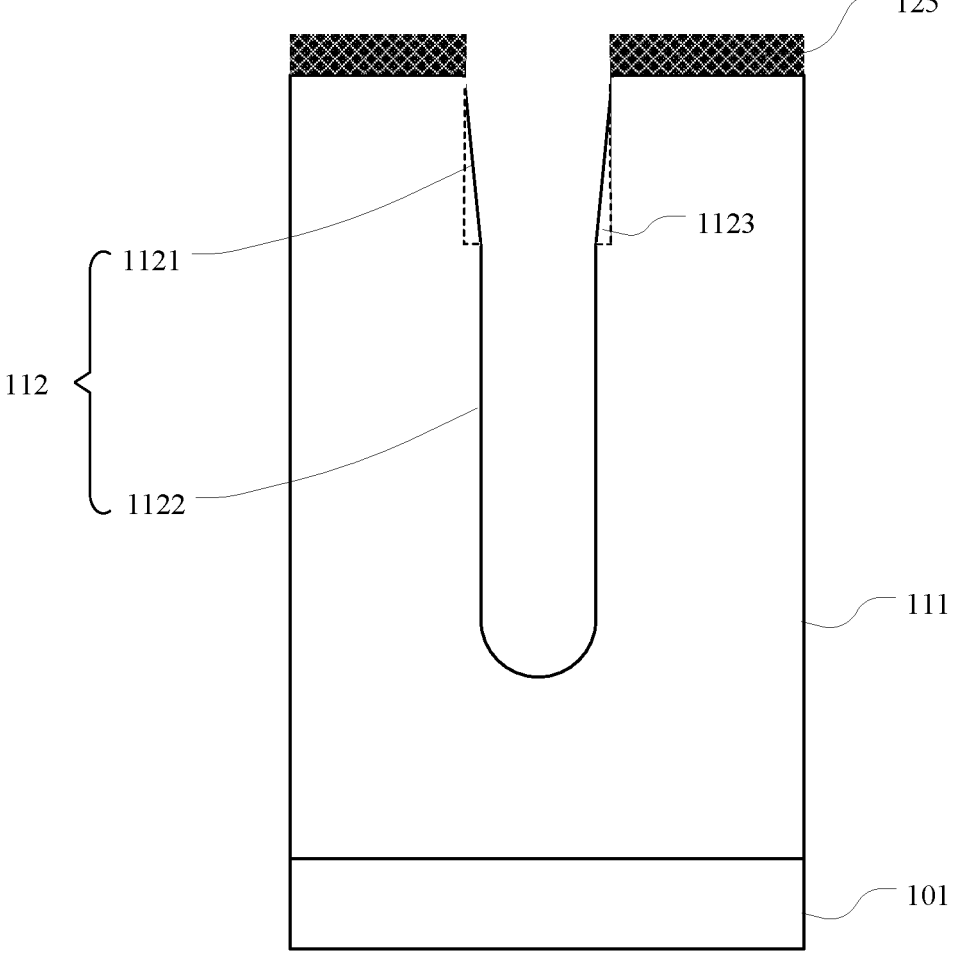
Figure 3D:
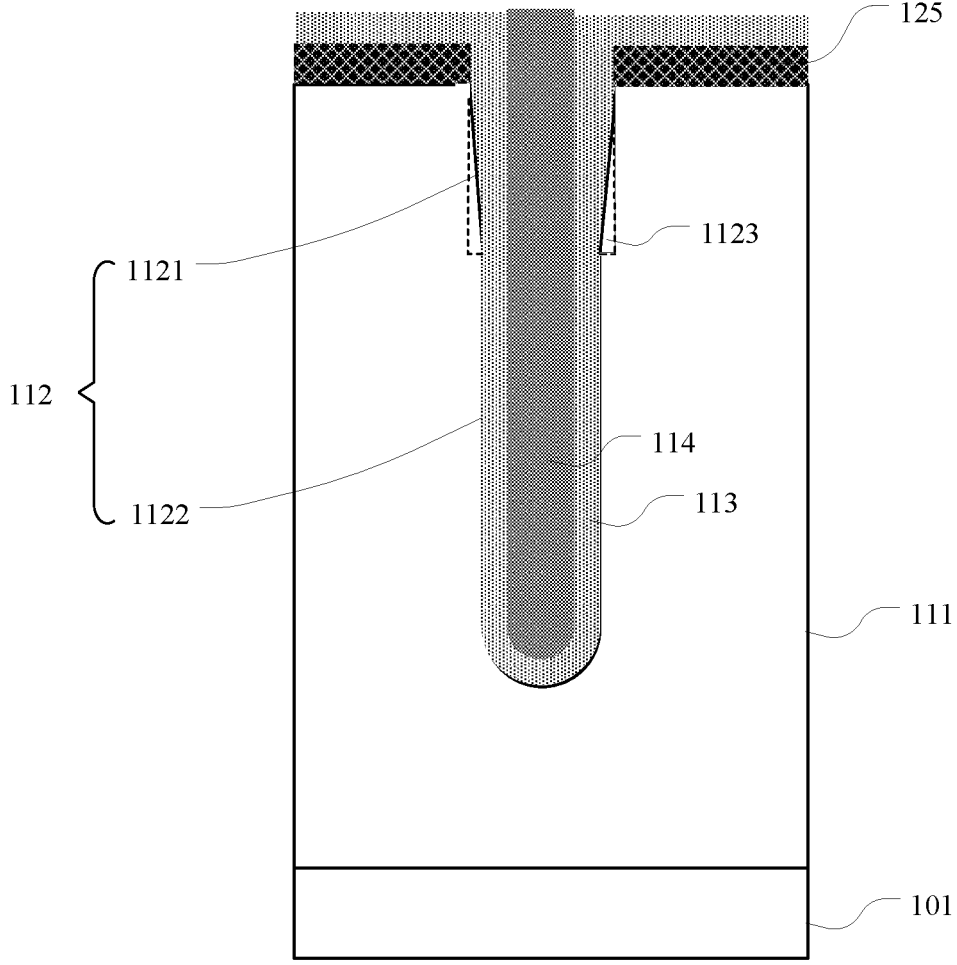
Figure 3E:
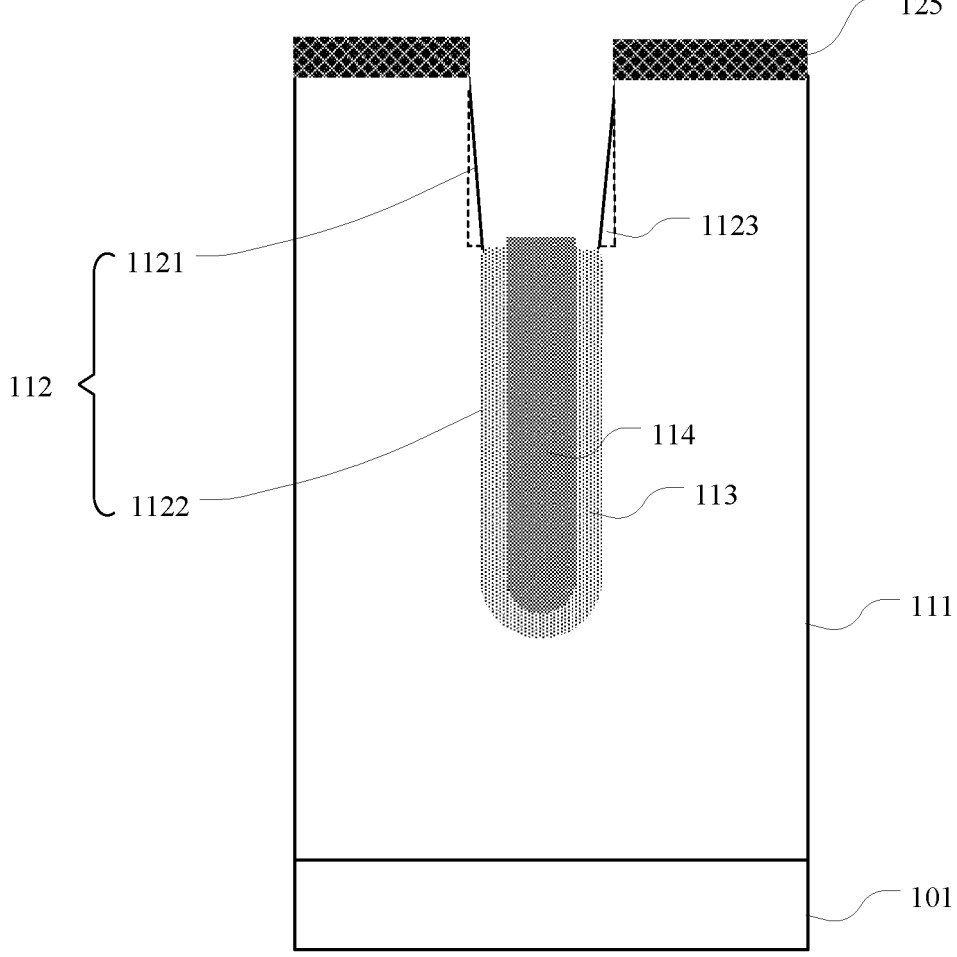
Figure 3F:
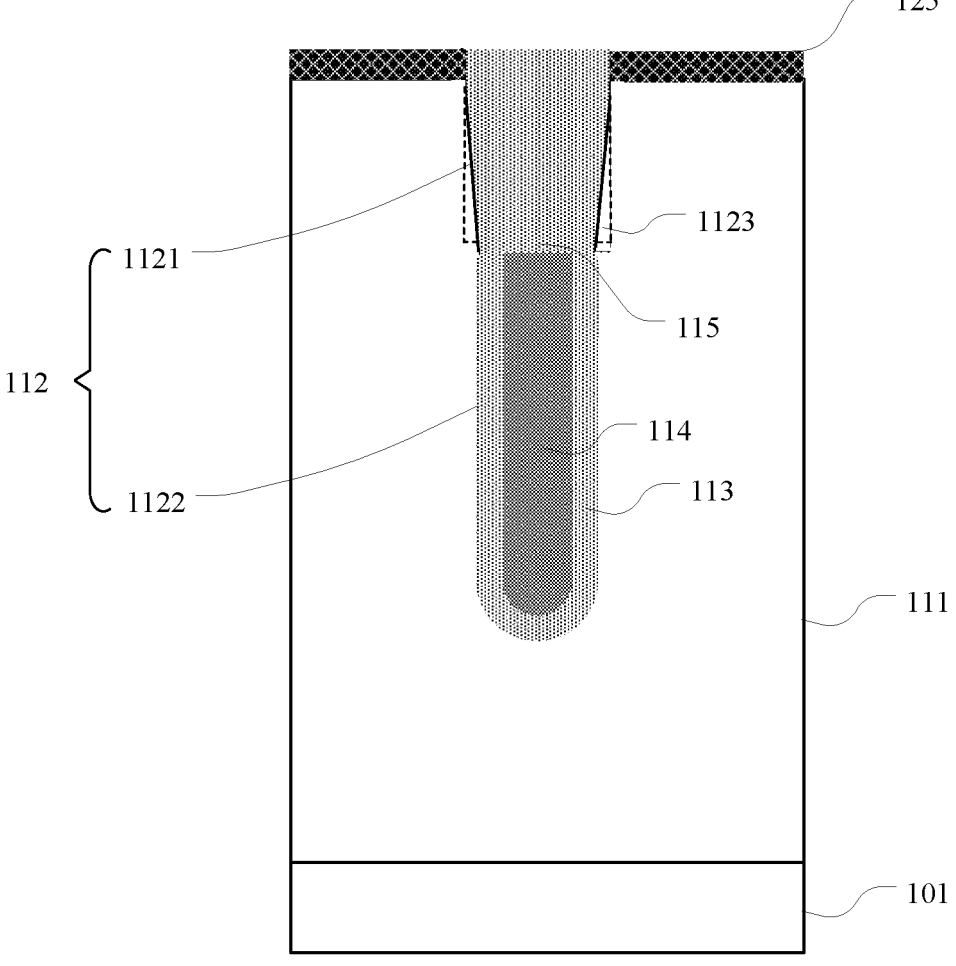
Figure 3G:
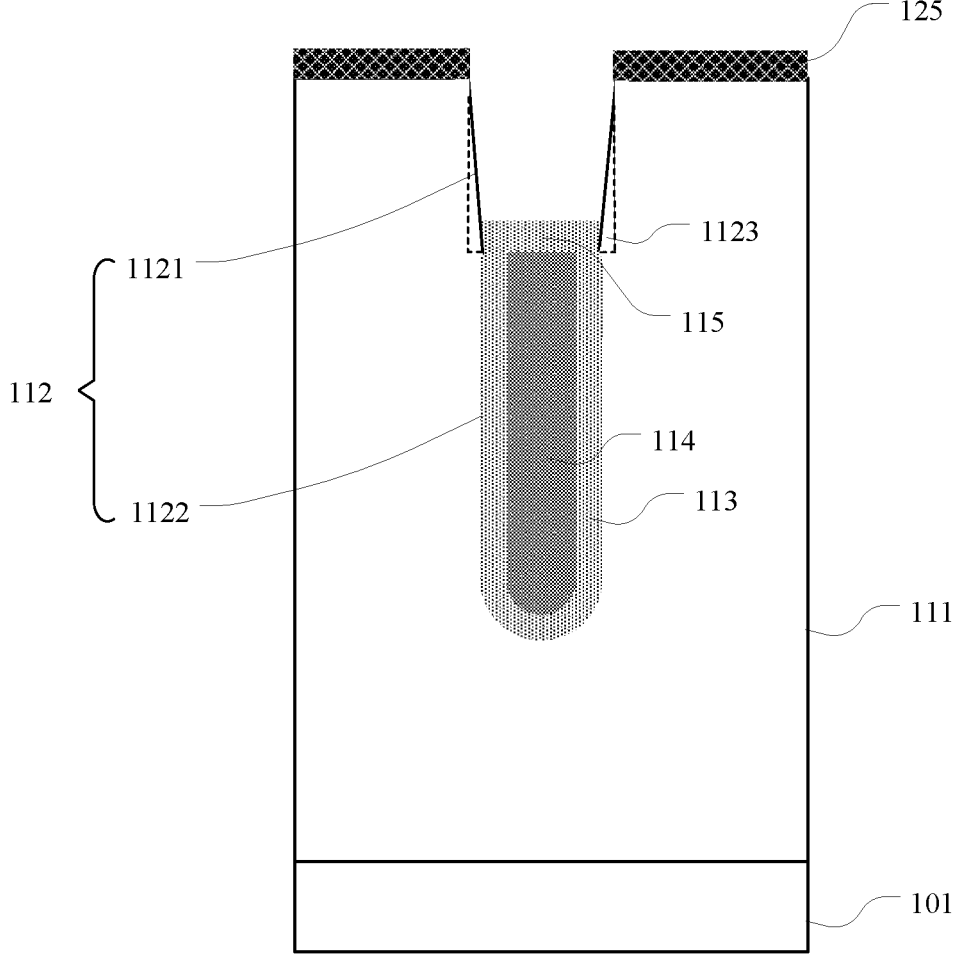

Step S2: forming a second trench 1122 communicated with the first trench 1121 by using the first trench 1121, the first trench 1121 and the second trench 1122 extending in a same extension, as shown in FIG. 3*c*.

In step S2, for example, the semiconductor layer is etched with the molding layer 1123 as the hard mask to form the second trench 1122, such that an inner diameter of the second trench 1122 is roughly the same as the inner diameter of the bottom of the first trench 1121. The first trench 1121 is communicated with the second trench 1122. In the later process, the first trench 1121 and the second trench 1122 may be taken as a whole and referred to as a trench 112.

Step S3: dielectric layers and electrode conductors are formed in the trench 112 as shown in FIGS. 3*d*-3*h*.

In step S3, a first dielectric layer 113 covering an inner surface of the second trench 1122, a second dielectric layer 117 covering an inner surface of the first trench 1121, a first conductor 114 positioned in the second trench 1122, a third dielectric layer 115 covering a surface of the first conductor 114, and a second conductor 118 positioned in the first trench 1121 are formed.

Specifically, the first dielectric layer 113 and the first conductor 114 are formed in the second trench 1122, the first dielectric layer 113 is located on sidewall and bottom of the second trench 1122 and isolates the first conductor 114 from the semiconductor layer 111; the third dielectric layer 115 is formed on top of the first conductor 114; the second dielectric layer 117 and the second conductor 118 are formed in the first trench 1121, the second dielectric layer 117 is positioned on a sidewall of the first trench 1121 and isolates the second conductor 118 from the semiconductor layer 111; wherein, the dielectric layers comprise the first dielectric layer 113, the second dielectric layer 117, and the third dielectric layer 115; the electrode conductors comprise the first conductor 114 and the second conductor 118. In this embodiment, the first conductor 114 is a shielding conductor, the second conductor 118 is a gate conductor and the second dielectric layer 117 is a gate dielectric layer.

As an example, the first dielectric layer 113 is formed inside the trench and on an upper surface of the epitaxial semiconductor layer 111 by thermal oxidation or chemical vapor deposition, that is, the first dielectric layer 113 covers bottom and sidewall of the trench, and the upper surface of the epitaxial semiconductor layer 111; the first dielectric layer 113 may be composed of an oxide or a nitride, for example, silicon oxide or silicon nitride.

Subsequently, the shielding conductor is formed inside the trench and on the upper surface of the epitaxial semiconductor layer 111 by low-pressure chemical vapor deposition. The shielding conductor is isolated from the epitaxial semiconductor layer 111 by the first dielectric layer 113.

The shielding conductor is first subjected to chemical mechanical grinding, and then the shielding conductor is selectively etched back with respect to the first dielectric layer 113, so that a portion, which is positioned on the upper surface of the epitaxial semiconductor layer 111 and inside the first trench 1121, of the shielding conductor is removed, and a remaining portion of the shielding conductor is regarded as the shielding conductor 114 shown in FIG. 2. The back etching process may be a dry etching process, and the shielding conductor 114 may be composed of polysilicon.

Subsequently, by use of the above-mentioned known etching process, the first dielectric layer 113 is selectively etched with respect to the epitaxial semiconductor layer 111, and a portion, which is positioned on the upper surface of the epitaxial semiconductor layer 111 and inside the first trench 1121, of the first dielectric layer 113 is removed, such that the remaining portion of the first dielectric layer 113 is positioned between the sidewall of the trench and the shielding conductor 114, and the first dielectric layer 113 does not cover a top of the shielding conductor 114, for example, a surface of the first dielectric layer 113 is lower than a surface of the shielding conductor 114. The etching process can be a wet etching process, which is mainly performed on a relatively flat film surface to form a roughness surface, thus increasing optical path and reducing light reflection. Diluted HF or BOE (Buffered-Oxide-Etch) solution can be used for the wet etching process. In another embodiment, this step of the etching process may also be omitted, so that the first dielectric layer 113 is conformal with the subsequently formed third dielectric layer 115, and then the first dielectric layer 113 and the third dielectric layer 115 can be etched together. Whether the specific etching process of this step is omitted or not can be decided by those skilled in the art according to an actual process requirement.

Subsequently, the third dielectric layer 115 is conformally formed on tops of the shielding conductor 114 and the first dielectric layer 113 by a plasma enhanced chemical vapor deposition process. The third dielectric layer 115 covers the tops of the shielding conductor and the first dielectric layer 113, and is located on the sidewall of the first trench 1121 and the upper surface of the epitaxial semiconductor layer 111. The third dielectric layer 115 may be composed of an oxide or a nitride, for example, silicon oxide or silicon nitride.

In this example, since the inner diameter of the first trench 1121 which has been previously provided is larger than the inner diameter of the second trench 1122, thereby facilitating enlargement of the process window, so as to avoid creating a void in the third dielectric layer 115 during a process for forming the third dielectric layer 115 without affecting the device size.

Subsequently, a portion, which is positioned on the upper surface of the epitaxial layer, of the third dielectric layer 115 is removed by a CMP (chemical mechanical grinding) process, and then the third dielectric layer 115 in the trench is etched back by use of BOE (Buffered-Oxide-Etch) solution, so that a portion, which is positioned on the top of the shielding conductor 114, of the third dielectric layer 115 is remained with a certain thickness. In the present disclosure, the method of forming the third dielectric layer 115 is not limited and a person skilled in the art can select an appropriate method to form the third dielectric layer 115 according to an actual situation.

Subsequently, an oxide layer, which serves as the gate dielectric layer 117 is formed on the sidewall of the first trench 1121 by performing a thermal oxidation process, so that the sidewall of the trench is covered by the gate dielectric layer 117. Usually, the thermal oxidation process is implemented by performing a chemical reaction between silicon and a gas containing an oxidizing substance, such as water vapor and oxygen, at high temperature, so as to form a dense silicon dioxide ($SiO_2$) film on a surface of silicon wafer, which is an important process in silicon planar technology.

Further, by a low-pressure chemical vapor deposition process, polysilicon is filled in the trench covered with the gate dielectric layer 117 to form a gate conductor 118, which comprises a first portion located in the trench and a second portion located on the upper surface of the trench. A portion, which is positioned on the upper surface of the epitaxial semiconductor layer 111, of the first portion of the gate conductor is then removed by back etching or chemical mechanical planarization, such that an upper end of the gate conductor 118 terminates at an opening of the trench. Alternatively, a portion of the conductor layer forming the gate conductor 118 is selectively removed with respect to the epitaxial semiconductor layer 111, and the conductor layer is etched back, so that the gate conductor 118 in the trench is located at an upper surface of the epitaxial semiconductor layer 111. The shielding conductor 114 and the gate conductor 118 are insulated from each other by the third dielectric layer 115, which has a significant mass and thickness to support a potential difference that may exist between the shielding conductor 114 and the gate conductor 118.

After the dielectric layer and the electrode conductor in the trench 112 is formed, the first hard mask 125 may be removed with respect to the epitaxial semiconductor layer 111 by use of a selective etchant.

Step S4: a body region in the semiconductor layer 111 is formed adjacent to the first trench 1121, the body region has the second dopant type, wherein the second dopant type is opposite to the first dopant type.

Figure 3H:
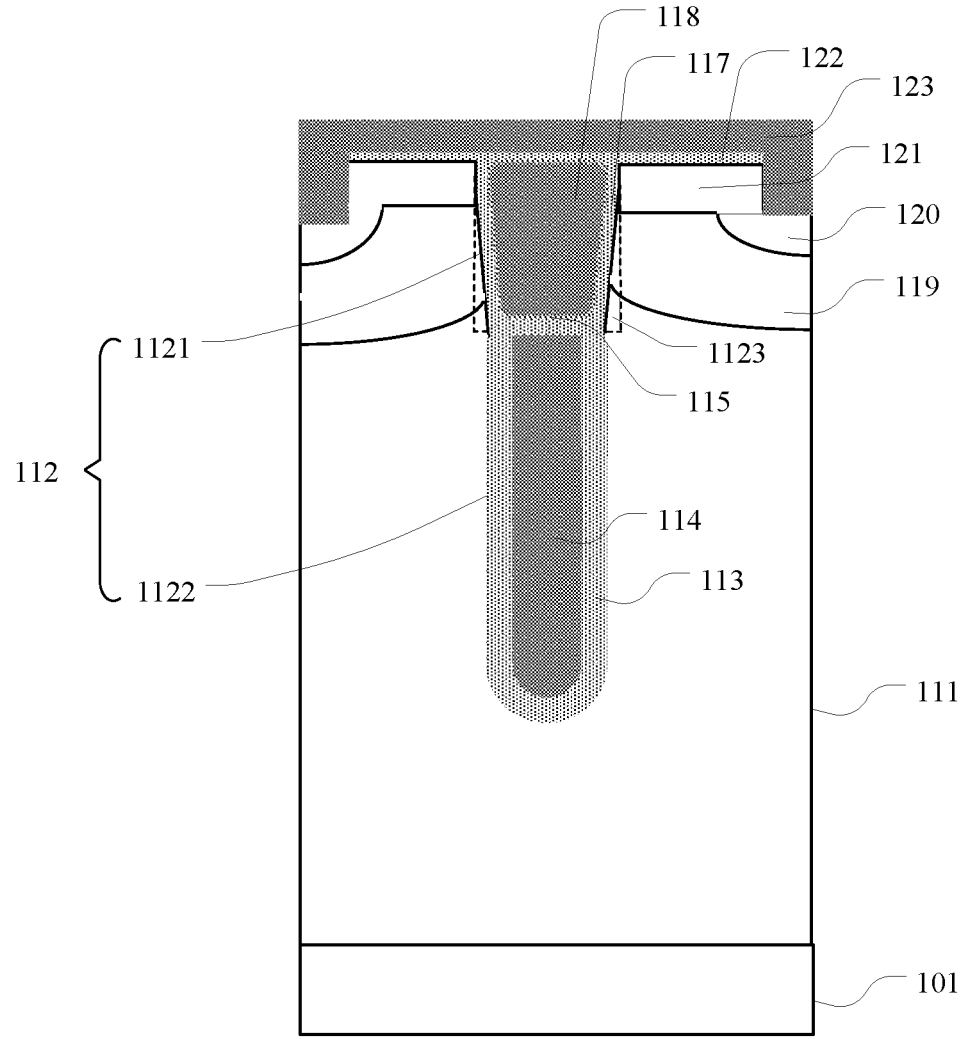
Figure 3I:
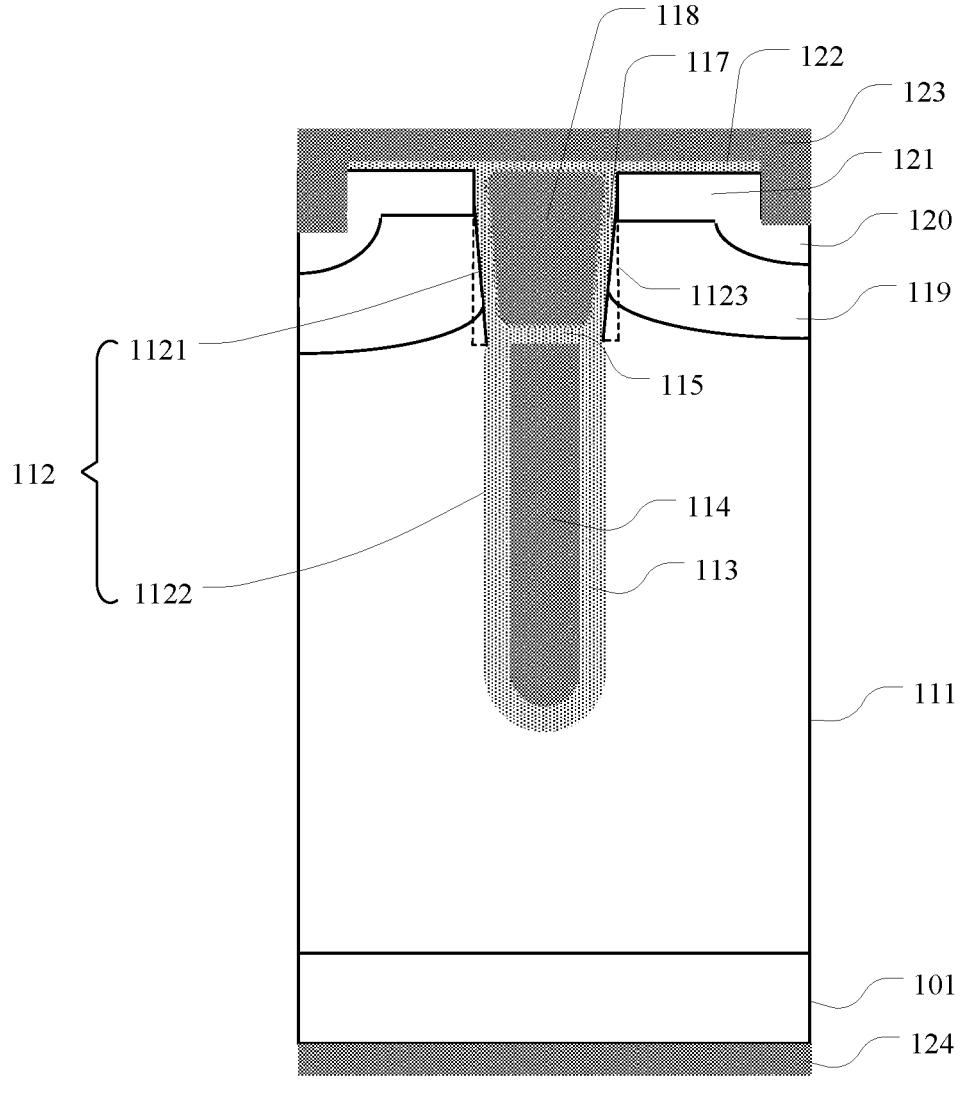

In step S4, by use of conventional bulk implantation and drive-in techniques, a first ion implantation process is performed to form the body region 119 of the second dopant type adjacent to the first trench 1121 in the epitaxial semiconductor layer 111, as shown in FIGS. 3h-3i.

Further, a second ion implantation process is performed to form a source region 121 of the first dopant type in the body region 119. The body region 119 of the second dopant type and the epitaxial semiconductor layer 111 of the first dopant type have opposite dopant types. By controlling parameters of ion implantation, such as implantation energy and dosage, a desired depth and a desired doping concentration can be achieved, and the depth of the body region 119 does not exceed an extension depth of the gate conductor 118 in the trench. By use of an additional photoresist mask, lateral extension regions of the body region 119 and the source region 121 can be controlled. Preferably, both of the body region 119 and the source region 121 are adjacent to the trench, and are isolated from the gate conductor 118 by the gate dielectric 117.

Subsequently, by the above-described known deposition process, an interlayer dielectric layer 122 located on the source region 121 is formed, and if necessary, a chemical mechanical planarization process is further performed to obtain a flat surface. The interlayer dielectric layer 122 covers the top surfaces of the source region 121 and the gate conductor 118, and a portion, which is located on the upper surface of the epitaxial semiconductor layer 111, of the gate oxide layer may be removed by etching after the source region is formed, or may be conformal with the interlayer dielectric layer 122 and located on the source region 121 without being removed. By use of the above-described known etching process and ion implantation process, a body contact region 120 of the second dopant type is formed in the body region 119; by use of the above-described known etching process, a conductive channel penetrating the interlayer dielectric layer 122 and the source region 121 to reach the body contact region 120 is formed, a source electrode 123 is formed on the interlayer dielectric layer 122, and the source electrode 123 is connected to the body contact region 120 via the conductive channel.

Subsequently, by use of the above-described known deposition process, the drain electrode 124 is formed on the second surface of the semiconductor substrate 101 which has been thinned by thinning technique.

In the above embodiments, the source electrode 123, the gate conductor 118, the shielding conductor 114, and the drain electrode 124 may each be formed of a conductive material including a metal material, such as an aluminum alloy or copper.

In the above description, technical details such as composition and etching process for each layer are not explained in detail. However, it should be understood by those skilled in the art that a layer/region (or the like) of a desired shape can be formed by various technical means. In addition, in order to form a same structure, those skilled in the art may devise methods that are not exactly the same as those described above. In addition, although each embodiment has been described separately above, this does not mean that the measures in each embodiment cannot be advantageously used in combination.

Embodiments of the present disclosure are described above. However, these embodiments are for illustrative purposes only and are not intended to limit the scope of the present invention. The scope of the present invention is defined by the appended claims and their equivalents. Without departing from the scope of the present disclosure, a variety of substitutions and modifications may be made by those skilled in the art which should fall within the scope of the present invention.

What is claimed is:

1. A manufacturing method of a split-gate MOSFET, wherein the manufacturing method comprises:
  forming a cavity extending from an upper surface of a semiconductor layer of a first dopant type to an interior of the semiconductor layer;
  forming a molding layer covering a sidewall of the cavity, wherein an inner diameter of a portion, which is close to a lower part of the cavity, of the molding layer is smaller than an inner diameter of a portion, which is close to a top of the cavity, of the molding layer, and a first trench is formed at a portion, which is free of the molding layer, of the cavity,
  forming a second trench communicated with the first trench by using the first trench, the first trench and the second trench extending in a same extension;
  forming a first dielectric layer covering an inner surface of the second trench and a second dielectric layer covering an inner surface of the first trench;
  forming a first conductor located in the second trench, the first conductor being isolated from the semiconductor layer by the first dielectric layer;
  forming a third dielectric layer covering a surface of the first conductor;
  forming a second conductor located in the first trench, the second conductor being isolated from the semiconductor layer by the second dielectric layer, the first conductor being isolated from the second conductor by the third dielectric layer; and
  forming a body region of a second dopant type that is located in the semiconductor layer and is adjacent to the first trench, wherein an inner diameter of the first trench is greater than an inner diameter of the second trench, and an inner diameter of a bottom of the first trench is smaller than an inner diameter of a top of the first trench.

2. The manufacturing method according to claim 1, wherein the inner diameter of the second trench is consistent with the inner diameter of the bottom of the first trench.

3. The manufacturing method according to claim 2, wherein an inner diameter of the molding layer gradually increases from bottom to top, such that the inner diameter of the first trench gradually increases from bottom to top.

4. The manufacturing method according to claim 2, wherein step of forming the molding layer comprises:
  forming a dielectric material covering the sidewall of the cavity; and
  removing part of the dielectric material to form the molding layer.

5. The manufacturing method according to claim 1, wherein a thickness of the first dielectric layer is greater than a thickness of the second dielectric layer.

6. The manufacturing method according to claim 1, wherein the manufacturing method further comprises:
  forming a source region located in the body region, the source region being of the first dopant type;
  forming an interlayer dielectric layer located on the source region; and
  forming a source electrode located on the interlayer dielectric layer.

7. The manufacturing method according to claim 1, wherein the manufacturing method further comprises:
  forming a body contact region of the second dopant type located in the body region; and
  forming a conductive channel that penetrates the interlayer dielectric layer and the source region to reach the body contact region, the source electrode being connected to the body contact region via the conductive channel.

8. The manufacturing method according to claim 1, wherein the semiconductor layer is formed on a semiconductor substrate, the semiconductor substrate is located on a lower surface of the semiconductor layer, and the upper surface of the semiconductor layer is opposite to the lower surface of the semiconductor layer; and the manufacturing method further comprises:
  forming a drain electrode located on a lower surface of the semiconductor substrate.

* * * * *